US008748271B2

(12) United States Patent
Toh et al.

(10) Patent No.: US 8,748,271 B2
(45) Date of Patent: Jun. 10, 2014

(54) LDMOS WITH IMPROVED BREAKDOWN VOLTAGE

(75) Inventors: Eng Huat Toh, Singapore (SG); Jae Gon Lee, Daegu (KR); Chung Foong Tan, Yishun Sapphire (SG); Elgin Quek, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/046,313

(22) Filed: Mar. 11, 2011

(65) Prior Publication Data

US 2012/0228695 A1   Sep. 13, 2012

(51) Int. Cl.
*H01L 29/772* (2006.01)
*H01L 29/40* (2006.01)
*H01L 29/49* (2006.01)
*H01L 29/78* (2006.01)
*H01L 29/51* (2006.01)
*H01L 29/66* (2006.01)
*H01L 29/423* (2006.01)

(52) U.S. Cl.
CPC .......... *H01L 29/7816* (2013.01); *H01L 29/512* (2013.01); *H01L 29/66545* (2013.01); *H01L 29/513* (2013.01); *H01L 29/42368* (2013.01); *H01L 29/66681* (2013.01); *H01L 29/402* (2013.01); *H01L 29/517* (2013.01); *H01L 29/4983* (2013.01); *H01L 29/495* (2013.01); *H01L 29/518* (2013.01)
USPC ................... 438/283; 257/328; 257/E29.261; 257/E21.417

(58) Field of Classification Search
USPC ............ 257/328, E29.261, E21.417; 438/283
See application file for complete search history.

(56) References Cited

U.S. PATENT DOCUMENTS

| 7,816,744 | B2 * | 10/2010 | Su et al. ..................... 257/409 |
| 2004/0201071 | A1 * | 10/2004 | Dosluoglu et al. ............ 257/431 |
| 2009/0176338 | A1 * | 7/2009 | Wang et al. .................... 438/151 |
| 2011/0163376 | A1 * | 7/2011 | Cheng et al. .................. 257/337 |
| 2011/0193161 | A1 * | 8/2011 | Zhu et al. ...................... 257/343 |
| 2012/0126323 | A1 * | 5/2012 | Wu et al. ....................... 257/343 |

OTHER PUBLICATIONS

Cortes et al., "Optimisation of low voltage Field Plate LDMOS transistors", Proceedings of the 2009 Spanish Conference on Electron Devices—Feb. 2009, pp. 475-478.

(Continued)

*Primary Examiner* — Marc Armand
(74) *Attorney, Agent, or Firm* — Ditthavong Mori & Steiner, P.C.

(57) ABSTRACT

An LDMOS is formed with a field plate over the n⁻ drift region, coplanar with the gate stack, and having a higher work function than the gate stack. Embodiments include forming a first conductivity type well, having a source, surrounded by a second conductivity type well, having a drain, in a substrate, forming first and second coplanar gate stacks on the substrate over a portion of the first well and a portion of the second well, respectively, and tuning the work functions of the first and second gate stacks to obtain a higher work function for the second gate stack. Other embodiments include forming the first gate stack of a high-k metal gate and the second gate stack of a field plate on a gate oxide layer, forming the first and second gate stacks with different gate electrode materials on a common gate oxide, and forming the gate stacks separated from each other and with different gate dielectric materials.

12 Claims, 8 Drawing Sheets

(56) References Cited

OTHER PUBLICATIONS

Efland et al., "Lateral Thinking About Power Devices (LDMOS)", IEEE, 1998, pp. 26.1.1-26.1.4.

Jung et al., Integration Friendly Dual Metal Gate Technology Using Dual Thickness Metal Inserted Poly-Si Stacks (DT-MIPS), 2007 Symposium on VLSI Technology Digest of Technical Papers, pp. 196-197.

Ludikhuize, Adriaan W., "A Review of Resurf Technology", ISPSO, May 2000, pp. 11-18.

Marbell et al., "Effects of Dummy Gate on Breakdown and Degradation of LDMOSFETs", IEEE Transactions on Devices and Materials Reliability, vol. 8, No. 1, Mar. 2008, pp. 193-202.

Schram et al., "Novel Process to Pattern Selectively Dual Dielectric Capping Layers Using Soft-Mask Only", 2008 Symposium on VLSI Technology Digest of Technical Papers, pp. 44-45.

Shibib et al., "Control of Hot Carrier Degradation in LDMOS Devices by a Dummy Gate Field Plate: Experimental Demonstration", Proceedings of 2004 International Symposium on Power Semiconductor Devices & ICs, pp. 233-235.

Shrivastava et al., "Part I: Mixed-Signal Performance of Various High-Voltage Drain-Extended MOS Devices", IEEE Transactions on Electron Devices, vol. 57, No. 2, Feb. 2010, pp. 448-457.

Shrivastava et al., "Part II: A Novel Scheme to Optimize the Mixed-Signal Performance and Hot-carrier Reliability of Drain-Extended MOS Devices", IEEE Transactions on Electron Devices, vol. 57, No. 2, Feb. 2010, pp. 458-465.

Wu et al., "30-W/mm GaN HEMTs by Field Plate Optimization", IEEE Electron Device Letters, vol. 25, No. 3, Mar. 2004, pp. 117-119.

Yuan et al., "A Novel Split-Gate MOSFET Design Realized by a Fully Silicided Gate Process for the Improvement of Transconductance and Output Resistance", IEEE Electron Device Letters, vol. 26, No. 11, Nov. 2005, pp. 829-831.

\* cited by examiner

LDMOS WITH IMPROVED BREAKDOWN VOLTAGE

TECHNICAL FIELD

The present disclosure relates to embedded high voltage transistors with a high breakdown voltage. The present disclosure is particularly applicable to lateral diffused MOS (LDMOS) transistors.

BACKGROUND

Embedded high voltage (HV) transistors are gaining importance as the need for both high voltage transistors and low voltage transistors to co-exist on the same chip rises. Applications of embedded HV transistors include automobiles, displays electronics, telecommunications, and power converters. One of the common architectures used for HV devices is the lateral diffused MOS (LDMOS) transistor, such as that illustrated in FIG. 1. As shown, shallow trench isolation (STI) regions 101 are formed in an n$^-$ region 103 on p-substrate 105. Typically, n$^-$ region 103 is formed epitaxially or by well implant. Gate 107 and gate dielectric 109 are formed on a p$^-$ doped buried body 111 in n$^-$ region 103 between two STI regions 101. Source (n$^+$) 113 and p$^+$ region 115 are formed in buried body 111 adjacent one STI region 101, and drain (n$^+$) 117 is formed in n$^-$ region 103 adjacent another STI region 101. An inter layer dielectric (ILD) 119 is formed over the entire device. The LDMOS transistor can operate over a wide range of breakdown voltages (from 6 volt (V) to greater than 50 V). The main challenges for HV transistors are the breakdown voltage ($V_{br}$) and the parasitic resistance in the on-state ($R_{dson}$), which are inversely related. The n$^-$ region 103, or n$^-$ drift region, of the LDMOS is employed to increase $V_{br}$ by sustaining a larger depletion width/voltage drop. The drawback of the n$^-$ region is the higher $R_{dson}$ (the sum of the resistances of the source ($R_s$), the channel ($R_{ch}$), the drift ($R_{drift}$), and the drain ($R_d$)) due to a lower doped drain.

To increase the breakdown voltage of the LDMOS, a field plate 201 or 203 has been added as illustrated in FIGS. 2A and 2B, respectively. The field plate, i.e. the extended gate 201 or extra gate 203, sits on a thicker oxide above the n$^-$ epi region 103 and could be shorted to the gate/source, floated, grounded or independently biased. The field plate helps widen the depletion width/reduce the peak electric field at the surface of the n$^-$ drift region, which in turn allows the device to sustain a larger voltage before breakdown occurs. Adverting to FIGS. 3 through 5, FIG. 3 schematically illustrates the depletion width near the gate edge for the LDMOS of FIG. 1, without a field plate. FIGS. 4 and 5 respectively show schematics of the energy band diagram extracted vertically from the field plate to the drain and the depletion width near the gate edge for the LDMOS of FIG. 2B, with a field plate. As illustrated, the depletion width increases with a field plate, the electric field is reduced, and the LDMOS has a higher $V_{br}$. Alternatively, for a fixed blocking voltage, the n-epi concentration or the lateral extended drain (drift region) concentration may be increased, thereby reducing $R_{dson}$.

A need therefore exists for LDMOS devices exhibiting a high $V_{br}$ while maintaining a low $R_{sdon}$, and for enabling methodology.

SUMMARY

An aspect of the present disclosure is a method of fabricating an LDMOS by forming a field plate over the n$^-$ drift region, coplanar with the gate stack, and having a higher work function than the gate stack.

Another aspect of the present disclosure is an LDMOS with a field plate over the n$^-$ drift region, coplanar with the gate stack, and having a higher work function than the gate stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of forming a first well and a second well surrounding the first well in a substrate; doping the first well with a first conductivity type dopant and the second well with a second conductivity type dopant; forming a source in the first well and a drain in the second well; forming a doped region of the first conductivity type dopant in the first well, the doped region functioning as a body contact to the first well; forming first and second coplanar gate stacks on the substrate over a portion of the first well and a portion of the second well, respectively; and tuning the work functions of the first and second gate stacks to obtain a higher work function for the second gate stack.

Aspects of the present disclosure include tuning the work functions by: forming a high-k dielectric layer and a metal gate as the first gate stack; and forming an oxide layer and a polysilicon or amorphous silicon (a-Si) field plate as the second gate stack. Further aspects include forming an oxide layer over the portion of the first well and the portion of the second well; forming a polysilicon or an a-Si layer on the oxide layer; forming an interlayer dielectric on the substrate surrounding the oxide layer and polysilicon or a-Si layer; removing the polysilicon or a-Si layer and the oxide layer over the first well, forming a cavity over the first well; depositing the high-k dielectric or an oxide layer followed by the high-k dielectric in the cavity; and depositing a metal on the high-k dielectric. The high-k layer may include a work function tuning layer, just prior to the metal gate deposition. Another aspect includes forming a p$^+$ doped a-Si layer on the oxide layer. An additional aspect includes independently biasing the field plate.

Other aspects include tuning the work functions by: forming an oxide layer on the substrate over the portion of the first well and the portion of the second well; and forming a first gate material on the oxide layer over the portion of the first well and a second gate material on the oxide layer over the portion of the second well, the second gate material having a higher work function than the first gate material. Further aspects include forming a polysilicon layer on the entire oxide layer; implanting an n$^+$ dopant in the polysilicon over the portion of the first well, to form the first gate material; and implanting a p$^+$ dopant in the polysilicon over the portion of the second well, to form the second gate material. Additional aspects include forming an undoped, n-doped, or p-doped polysilicon layer on the entire oxide layer; and implanting antimony (Sb) in the polysilicon over the portion of the first well, to form the first gate material, the undoped, n-doped, or p-doped polysilicon forming the second gate material.

Another aspect includes tuning the work functions by: forming the first gate stack with a first dielectric layer and a metal gate, the first dielectric layer having a first work function; and forming the second gate stack with a second dielectric layer and a metal gate, the second dielectric having a second work function different from the first work function, and the first gate stack being separated from the second gate stack. Other aspects include forming first and second dummy gate stacks on the substrate over the portions of the first well and the second well, respectively; forming an interlayer dielectric (ILD) over the entire substrate; removing the first and second dummy gate stacks, forming first and second cavities, respectively; forming the first dielectric layer or an oxide layer followed by the first dielectric layer in the first cavity; forming the second dielectric layer or an oxide layer followed by the second dielectric layer in the second cavity; and forming a metal gate on each of the first and second dielectric layers. Additional aspects include forming the first and second dielectric layers by: depositing the same dielectric layer in the first and second cavities; implanting a first dopant in the dielectric layer in the first cavity; and implanting a second dopant in the dielectric layer in the second cavity, the second dopant being different from the first dopant.

Another aspect of the present disclosure is a device including: a substrate; a first well and a second well in the substrate, the first well being doped with a first conductivity type dopant, the second well being doped with a second conductivity type dopant, and the second well surrounding the first well; a source in the first well and a drain in the second well; a doped region of the first conductivity type dopant in the first well, the doped region functioning as a body contact to the first well; first and second coplanar gate stacks on the substrate, the first gate stack being formed on a portion of the first well, and the second gate stack being formed on a portion of the second well; wherein the work function of the second gate stack is higher than the work function of the second gate stack.

Aspects include a device including a high-k dielectric layer, or an oxide layer and a high-k dielectric layer, and a metal gate as the first gate stack; and an oxide layer and a polysilicon or amorphous silicon (a-Si) field plate as the second gate stack. Another aspect includes a p$^+$ doped a-Si field plate on the oxide layer. Further aspects include an oxide layer on the substrate over the portion of the first well and the portion of the second well; a first gate material on the oxide layer over the portion of the first well, forming the first gate stack; and a second gate material, having a higher work function than the first gate material, on the oxide layer over the portion of the second well, forming the second gate stack. Other aspects include an n$^+$ doped polysilicon as the first gate material; and a p$^+$ doped polysilicon as the second gate material. Additional aspects include antimony (Sb) doped polysilicon as the first gate material; and undoped polysilicon as the second gate material. Further aspects include a first dielectric layer, or an oxide layer and a first dielectric layer, and a metal gate as the first gate stack, the first dielectric layer having a first work function; and a second dielectric layer, or an oxide layer and a second dielectric layer, and a metal gate as the second gate stack, the second dielectric layer having a second work function different from the first work function, and the first gate stack being separated from the second gate stack. Another aspect includes a dielectric layer implanted with a first dopant as the first dielectric layer; and the same dielectric layer implanted with a second dopant as the second dielectric layer, the second dopant being different from the first dopant.

Another aspect of the present disclosure is a method including: forming a lateral diffused MOS (LDMOS) by: forming a first well and a second well in a substrate, the second well surrounding the first well; doping the first well with a p-type dopant and the second well with an n-type dopant; forming a source in the first well and a drain in the second well; and forming a p-doped region in the first well, the p-doped region functioning as a body contact to the first well; forming a first gate stack on the substrate over a portion of the first well; forming a second gate stack on the substrate over a portion of the second well, the first and second gate stacks being coplanar and being formed with different gate dielectric layers and/or with different gate electrodes, and the second gate stack having a higher work function than the first gate stack.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of low breakdown voltage and high parasitic resistance attendant upon forming an LDMOS transistor. In accordance with embodiments of the present disclosure, a high-k metal gate electrode is employed for channel control, and a field plate having a high work function is formed coplanar with the gate electrode, to increase the breakdown voltage while maintaining a low parasitic resistance. The field plate widens the depletion width, which reduces the peak electric field at the surface of the n⁻ drift region, which in turn increases the breakdown voltage.

Methodology in accordance with embodiments of the present disclosure includes forming a first well and a second well in a substrate, disposing the second well surrounding the first well, doping the first well with a first-type dopant and the second well with a second-type dopant, forming a source in the first well and a drain in the second well, forming a doped region of the first-type dopant in the first well, the doped region functioning as a body contact to the first well, forming first and second coplanar gate stacks on the substrate over a portion of the first well and a portion of the second well, respectively, and tuning the work functions of the first and second gate stacks to obtain a higher work function for the second gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 6A through 6F schematically illustrate a process flow for forming an LDMOS having a metal gate and an adjacent field plate, in accordance with an exemplary embodiment. Adverting to FIG. 6A, n⁻ Epi region (or n⁻ well) 601 and p⁻ well 603 are formed between STI regions 605 on a p-type substrate 607 by conventional methods.

Figure 1:
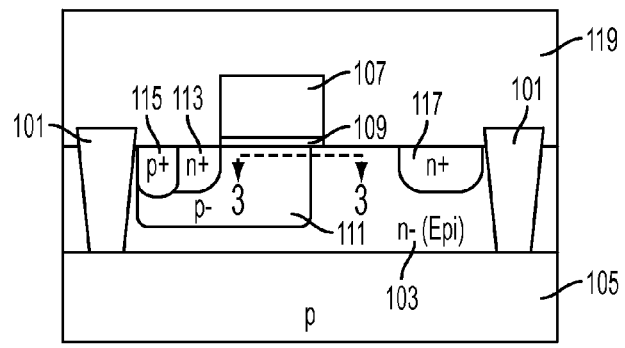
FIG. 1 schematically illustrates a prior art LDMOS.
Figure 2A:
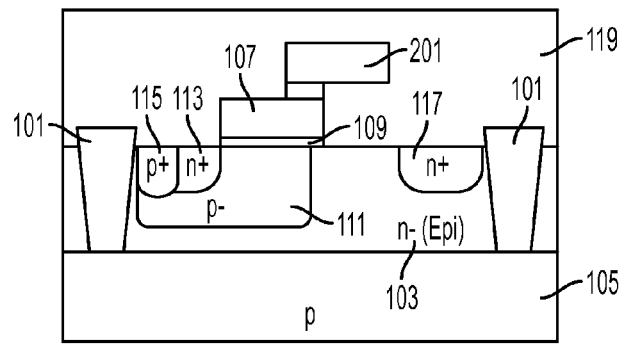
FIGS. 2A and 2B schematically illustrate an a prior art LDMOS with a field plate.
Figure 2B:
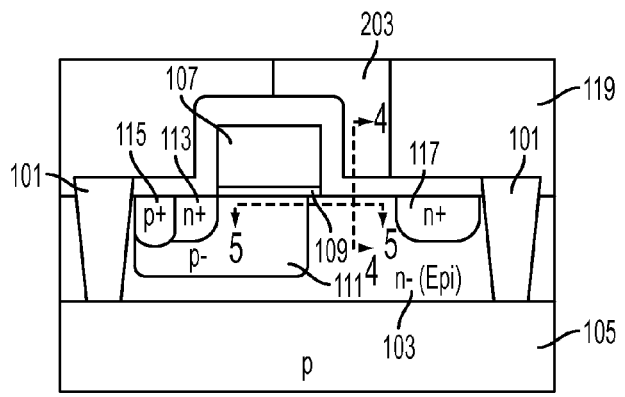
Figure 3:
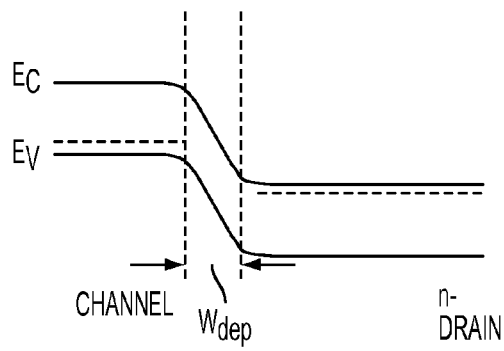
FIG. 3 schematically illustrates the depletion width of the LDMOS of FIG. 1.
Figure 4:
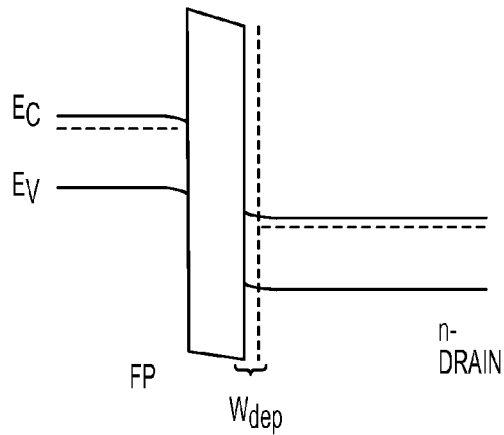
FIG. 4 schematically illustrates the energy band of the LDMOS of FIG. 2B.
Figure 5:
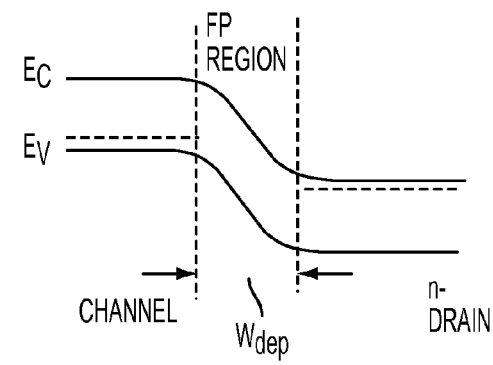
FIG. 5 schematically illustrates the depletion width of the LDMOS of FIG. 2B.
Figure 6A:
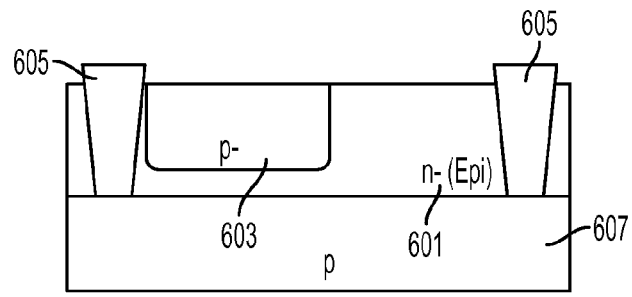
FIGS. 6A through 6F schematically illustrate a process flow for forming an LDMOS having a metal gate and an adjacent field plate, in accordance with an exemplary embodiment.
Figure 6B:
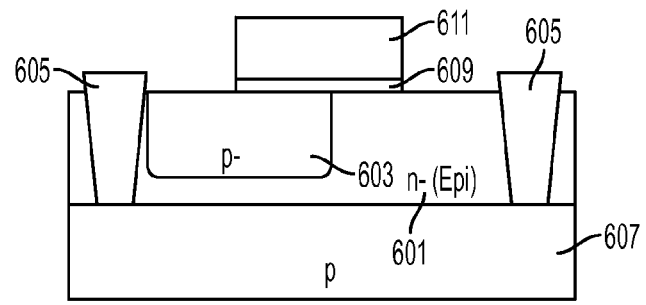

As illustrated in FIG. 6B, gate oxide 609 is formed to a thickness of 10 Å to 300 Å on a portion of p⁻ well 603 and a portion of n⁻ Epi region 601. Field plate 611 is formed to a thickness of 200 Å to 2000 Å on gate oxide 609. Field plate 611 may be formed of amorphous silicon (a-Si) and may be predoped with either an n⁺ or a p⁺ dopant, for example Arsenic (As) or Boron (B). P⁺ doped a-Si has a higher work function, and, therefore, may more effectively reduce the electric field in the n⁻ drift region by widening the depletion width and allowing potential to drop across a larger region. Alternatively, field plate 611 may be formed of doped polysilicon. Field plate 611 may be formed, for example, to a width of 300 nm, 50 nm of which may be over n⁻ Epi region 601. However, these dimensions are merely exemplary, as the dimensions depend on technology, product, and design.

Figure 6C:
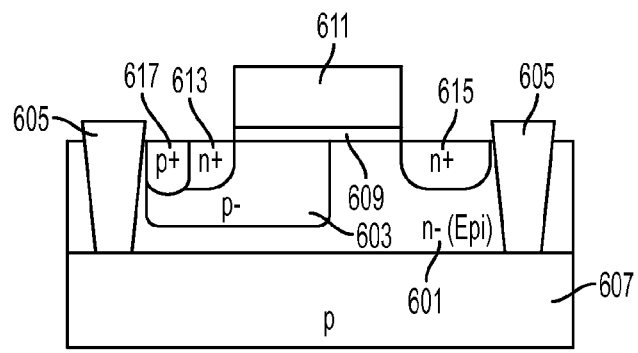

A lightly doped drain (LDD) may optionally be formed followed by spacer formation (not shown for illustrative convenience). Source 613 and drain 615 may then be formed in p-well 603 and n-well 601, respectively, as illustrated in FIG. 6C. In addition, p⁺ body 617 may be formed in p-well 603, which functions as a body contact to the p-well. Rapid thermal anneal (RTA) and source/drain silicidation may be performed by conventional methods.

Figure 6D:
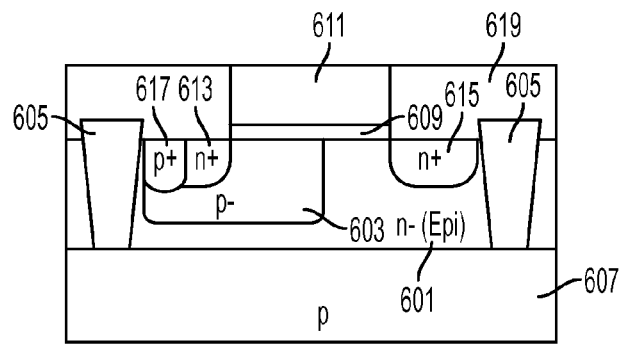
Figure 6E:
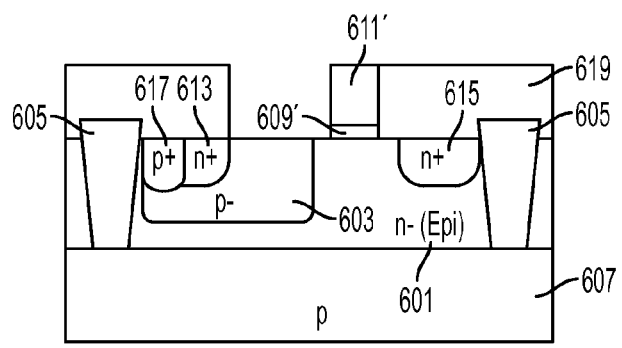

Adverting to FIG. 6D, an ILD 619, for example $SiO_2$, is formed over the entire substrate, including field plate 611. Chemical mechanical polishing (CMP) is performed to expose the top surface of field plate 611. Then, a portion of the field plate gate stack, for example 200 nm to 1000 nm, is removed, leaving gate oxide 609' and field plate 611', as illustrated in FIG. 6E.

Figure 6F:
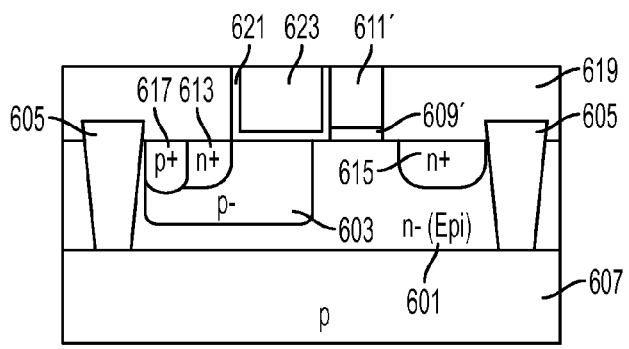

As illustrated in FIG. 6F, a high-k dielectric 621, for example hafnium silicon oxynitride (HfSiON) or $SiO_2$/HfSiON, is deposited in the opening formed by the removal of part of the field plate gate stack. Alternatively, an oxide layer (not shown for illustrative convenience) followed by high-k dielectric 621 may be deposited in the opening. The high-k dielectric 621 alternatively may include an additional work function tuning layer, e.g., lanthanum oxide ($La_2O_3$). Then, a metal gate 623 is deposited in the remainder of the opening followed by CMP. An oxide may be deposited for a thicker effective oxide thickness prior to the deposition of high-k dielectric 621. After CMP, back end of line (BEOL) processing may proceed.

Figure 7A:
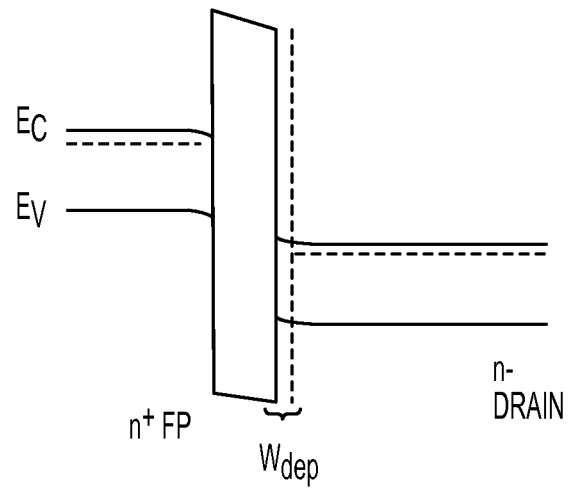
FIG. 7A schematically illustrates the depletion width of an LDMOS as illustrated in FIG. 6F, with a metal gate and an n$^+$ field plate.
Figure 7B:
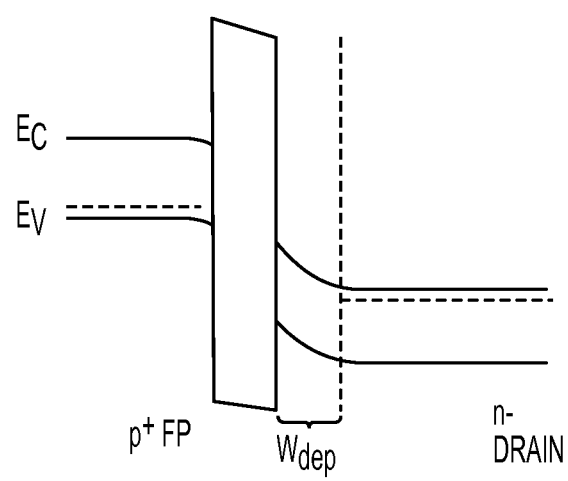
FIG. 7B schematically illustrates the depletion width of an LDMOS as illustrated in FIG. 6F, with a metal gate and a p$^+$ field plate.

FIGS. 7A and 7B schematically illustrate the energy band diagram extracted vertically from the field plate to the drain in the LDMOS of FIG. 6F for n⁺ and p⁺ field plates, respectively. As shown, a higher work function or p⁺ field plate results in a wider depletion width at the surface, which permits the device to sustain a higher voltage before breakdown.

FIGS. 8A through 8D schematically illustrate a process flow for forming an LDMOS having dual gate materials on a single oxide, in accordance with another exemplary embodiment, beginning with isolation and well formation as illustrated in FIG. 6A. Adverting to FIG. 8A, a gate oxide 801 and gate electrode 8B are formed on a portion of p⁻ well 603 and a portion of n⁻ Epi region 601. Gate oxide 801 may be formed to a thickness of 10 Å to 300 Å, and gate electrode 803 may be formed on gate oxide 801 to a thickness of 200 Å to 2000 Å. Gate electrode 803 may be formed, for example, of polysilicon or a-Si.

Figure 8A:
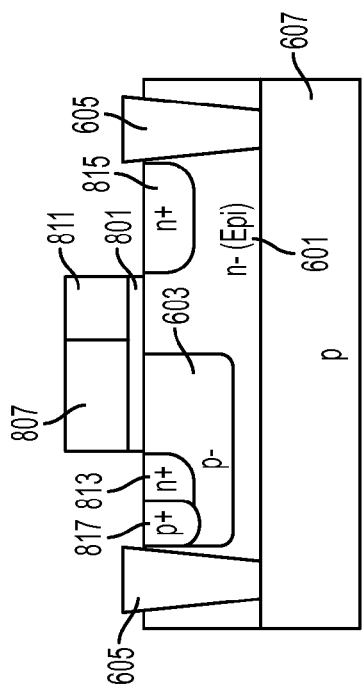
FIGS. 8A through 8D schematically illustrate a process flow for forming an LDMOS having dual gate materials on a single oxide, in accordance with another exemplary embodiment.
Figure 8C:
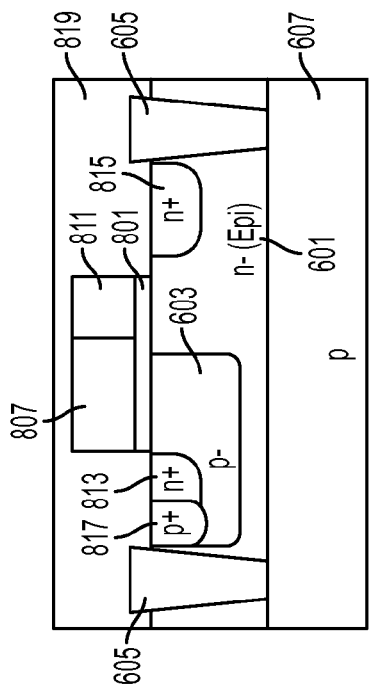
Figure 8B:
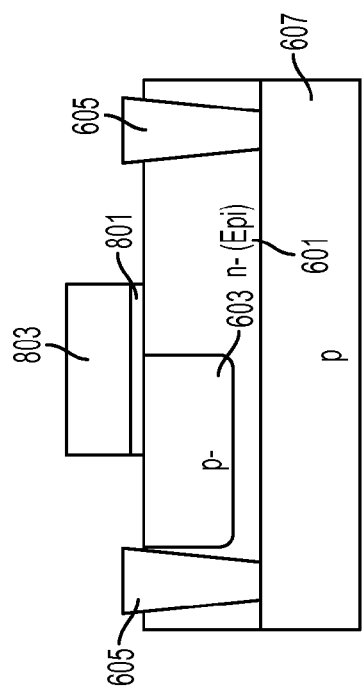

As illustrated in FIG. 8B, an n⁺ dopant 805, for example, As or Phosphorus (P), is implanted in a first part of gate electrode 803, forming first gate electrode 807. A p⁺ dopant 809, for example B, is implanted in the remainder of gate electrode 803, forming second gate electrode 811. Each implantation may be performed at an angle or by masking off the portion of gate electrode 803 which is not to receive the particular dopant. Alternatively, the gate electrode material may be doped prior to etching the gate and forming the gate stack 801/803.

A lightly doped drain (LDD) may optionally be formed followed by spacer formation (not shown for illustrative convenience). Source 813 and drain 815 may then be formed, as well as p⁺ body 817, as illustrated in FIG. 8C. Rapid thermal anneal (RTA) and source/drain silicidation may be performed by conventional methods.

Figure 8D:
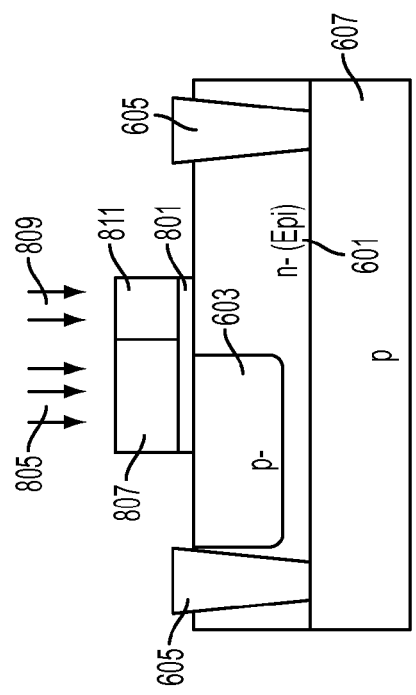

Adverting to FIG. 8D, an ILD 819, for example $SiO_2$, is formed over the entire substrate. Chemical mechanical polishing (CMP) may be performed, if necessary, and back end of line (BEOL) processing may proceed.

Although gate electrodes 807 and 811 have been described as being implanted with n⁺ and p⁺ dopants, respectively, for dual work functions, alternatively a work function tuning implant such as Sb may be utilized to create a lower work function for 807 and a higher work function for 811. Alternatively, entirely different gate electrode materials (with different work functions) may be utilized for gate electrodes 807 and 811. For example, gate electrode 807 may be formed of tantalum nitride (TaN) and gate electrode 811 may be formed of titanium nitride (TiN). In that case, the first material may be deposited as illustrated in FIG. 8A. Then, conventional masking and etching may be performed to remove a portion of gate electrode 803 and to deposit the second electrode material (not shown for illustrative convenience). The implantation steps shown in FIG. 8B may not be necessary if different materials are utilized for gate electrodes 807 and 811.

In accordance with another exemplary embodiment, FIGS. 9A through 9F schematically illustrate a process flow for forming an LDMOS having dual separated metal gates, beginning with isolation and well formation as illustrated in FIG. 6A. Adverting to FIG. 9A, two dummy gate stacks, 901 and 903, are formed on a portion of p⁻ well 603 and a portion of n⁻ Epi region 601, respectively. Each dummy gate stack may be formed, for example, of a SiO₂ dielectric layer and an a-Si gate electrode on the dielectric layer.

Figure 9A:
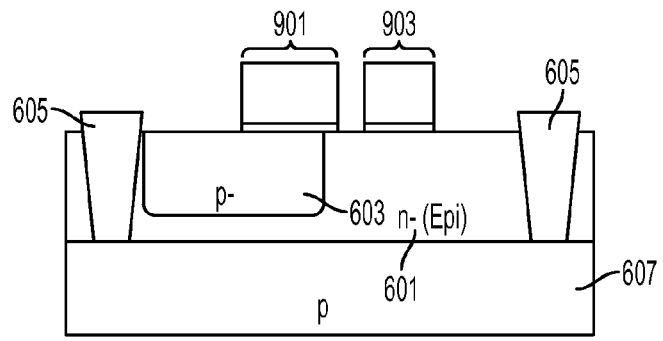
FIGS. 9A through 9F schematically illustrate a process flow for forming an LDMOS having dual separated metal gates, in accordance with another exemplary embodiment.
Figure 9B:
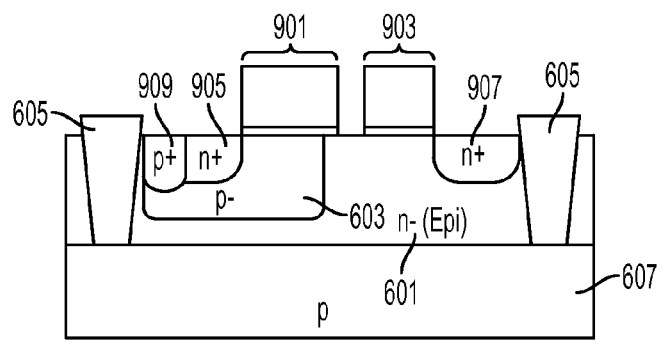

A lightly doped drain (LDD) may optionally be formed followed by spacer formation (not shown for illustrative convenience). Source 905 and drain 907 may then be formed, as well as p⁺ body 909, as illustrated in FIG. 9B. RTA and source/drain silicidation may then be performed by conventional methods.

Figure 9C:
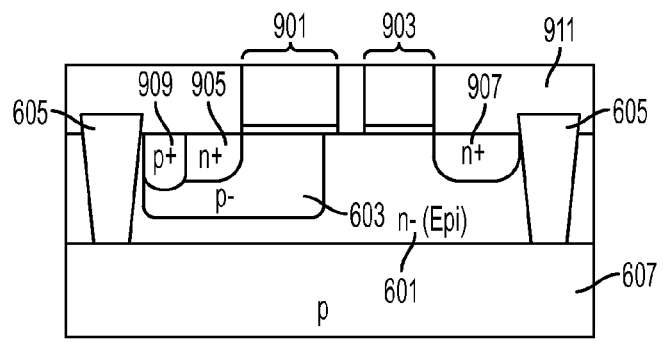

Adverting to FIG. 9C, an ILD 911, for example SiO₂, is formed over the entire substrate. Chemical mechanical polishing (CMP) is performed to expose the top surface of the dummy gate stacks.

Figure 9D:
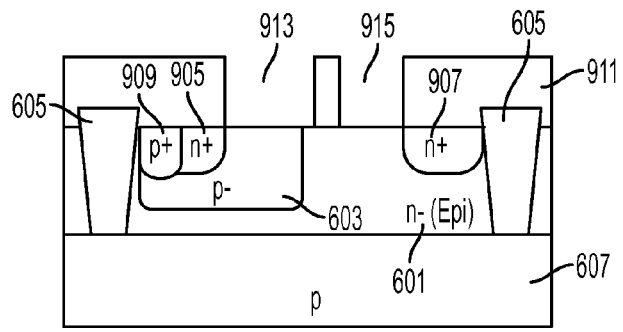
Figure 9E:
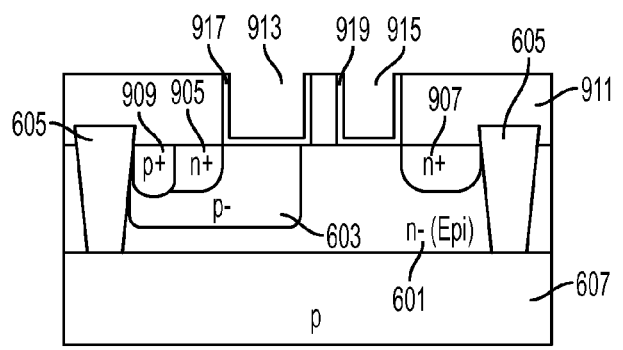

As illustrated in FIG. 9D, dummy gate stacks 901 and 903 are removed, as in a conventional replacement gate process. Cavities 913 and 915 are formed. A first gate dielectric 917 is then deposited in cavity 913, and a second gate dielectric 919 is deposited in cavity 915, as illustrated in FIG. 9E. Alternatively, each of gate dielectric 917 and gate dielectric 919 may be preceded by an oxide layer (not shown for illustrative convenience). First gate dielectric 917 and second gate dielectric 919 may be formed of different materials, for example HfSiON/La₂O₃ for dielectric 917 and HfSiON/TiN/Al/TiN for dielectric 919, to establish different work functions for the two dielectrics. Alternatively, the two dielectrics may both be formed of HfO₂, and then doped differently to create dual work functions.

Figure 9F:
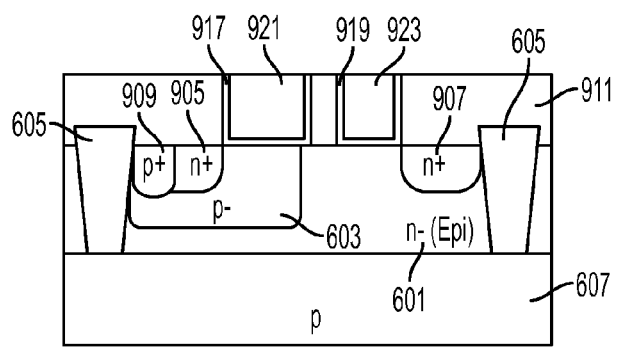

Adverting to FIG. 9F, a metal is deposited in cavities 913 and 915, forming metal gate electrode 921 and metal field plate 923. CMP is then performed, and BEOL processing may proceed.

The embodiments of the present disclosure can achieve several technical effects, including channel control and a high breakdown voltage while maintaining a low parasitic resistance. The present disclosure enjoys industrial applicability in any technologies employing embedded high voltage transistors, such as automobiles, display electronics, telecommunications, and power converters.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first well and a second well in a substrate, the second well surrounding the first well;
   doping the first well with a first conductivity type dopant and the second well with a second conductivity type dopant;
   forming one source in the first well and one drain in the second well;
   forming a doped region of the first conductivity type dopant in the first well, the doped region functioning as a body contact to the first well;
   forming first and second coplanar gate stacks on the substrate, a major portion of the first gate stack being formed over a portion of the first well and the second gate stack being formed over a portion of the second well, but not over the first well; and
   tuning the work functions of the first and second gate stacks to obtain a higher work function for the second gate stack than for the first gate stack,
   wherein the one source and the one drain are each associated with both the first and second coplanar gate stacks.

2. The method according to claim 1, comprising tuning the work functions by:
   forming a high-k dielectric layer and a metal gate as the first gate stack; and
   forming an oxide layer and a polysilicon or amorphous silicon (a-Si) field plate as the second gate stack.

3. The method according to claim 1, comprising tuning the work functions by:
   forming an oxide layer on the substrate over the portion of the first well and the portion of the second well; and
   forming a first gate material on the oxide layer over the portion of the first well and a second gate material on the oxide layer over the portion of the second well, the second gate material having a higher work function than the first gate material.

4. The method according to claim 1, comprising tuning the work functions by:
   forming the first gate stack with a first dielectric layer and a metal gate, the first dielectric layer having a first work function; and
   forming the second gate stack with a second dielectric layer and a metal gate, the second dielectric having a second work function different from the first work function, and the first gate stack being separated from the second gate stack.

5. The method according to claim 2, comprising:
   forming an oxide layer over the portion of the first well and the portion of the second well;
   forming a polysilicon or an a-Si layer on the oxide layer;
   forming an interlayer dielectric on the substrate surrounding the oxide layer and polysilicon or a-Si layer;
   removing the polysilicon or a-Si layer and the oxide layer over the portion of the first well, but not over the portion of the second well, forming a cavity over the portion of the first well;
   depositing the high-k dielectric or an oxide layer followed by the high-k dielectric in the cavity; and
   depositing a metal on the high-k dielectric.

6. The method according to claim 3, comprising:
   forming a polysilicon layer on the entire oxide layer;
   implanting an n+ dopant in the polysilicon over the portion of the first well, to form the first gate material; and
   implanting a p+ dopant in the polysilicon over the portion of the second well, to form the second gate material.

7. The method according to claim 3, comprising:
   forming an undoped, p-doped, or n-doped polysilicon layer on the entire oxide layer;
   implanting antimony (Sb) in the polysilicon over the portion of the first well, to form the first gate material, the undoped, p-doped, or n-doped polysilicon forming the second gate material.

8. The method according to claim 4, comprising:
forming first and second dummy gate stacks on the substrate over the portions of the first well and the second well, respectively;
forming an interlayer dielectric (ILD) over the entire substrate;
removing the first and second dummy gate stacks, forming first and second cavities, respectively;
forming the first dielectric layer or an oxide layer followed by the first dielectric layer in the first cavity;
forming the second dielectric layer or an oxide layer followed by the second dielectric layer in the second cavity; and
forming a metal gate on each of the first and second dielectric layers.

9. The method according to claim 5, comprising forming a p+ doped a-Si layer on the oxide layer.

10. The method according to claim 8, comprising forming the first and second dielectric layers by:
depositing the same dielectric layer in the first and second cavities;
implanting a first dopant in the dielectric layer in the first cavity; and
implanting a second dopant in the dielectric layer in the second cavity, the second dopant being different from the first dopant.

11. The method according to claim 9, further comprising independently biasing the field plate.

12. A method comprising:
forming a lateral diffused MOS (LDMOS) by:
forming a first well and a second well in a substrate, the second well surrounding the first well;
doping the first well with a p-type dopant and the second well with an n-type dopant;
forming one source in the first well and one drain in the second well; and
forming a p-doped region in the first well, the p-doped region functioning as a body contact to the first well;
forming a first gate stack on the substrate, a major portion of the first gate stack being formed over a portion of the first well;
forming a second gate stack on the substrate over a portion of the second well, and not over the first well, the first and second gate stacks being coplanar and being formed with different gate dielectric layers and/or with different gate electrodes, and the second gate stack having a higher work function than the first gate stack,
wherein the one source and the one drain are each associated with both the first and second gate stacks.

* * * * *